(12) United States Patent
Park et al.

(10) Patent No.: US 9,608,041 B2
(45) Date of Patent: Mar. 28, 2017

(54) SEMICONDUCTOR MEMORY DEVICE AND METHOD OF MANUFACTURING THE SAME

(71) Applicant: SK hynix Inc., Gyeonggi-do (KR)

(72) Inventors: Nam Kyun Park, Gyeonggi-do (KR); Kang Sik Choi, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/867,971

(22) Filed: Sep. 28, 2015

(65) Prior Publication Data

US 2016/0020254 A1  Jan. 21, 2016

Related U.S. Application Data

(63) Continuation of application No. 13/489,753, filed on Jun. 6, 2012, now abandoned.

(30) Foreign Application Priority Data

Dec. 15, 2011  (KR) .................. 10-2011-0135695

(51) Int. Cl.
| | |
|---|---|
| *H01L 27/24* | (2006.01) |
| *H01L 27/22* | (2006.01) |
| *H01L 27/10* | (2006.01) |
| *H01L 45/00* | (2006.01) |

(52) U.S. Cl.
CPC ........ *H01L 27/2454* (2013.01); *H01L 27/101* (2013.01); *H01L 27/228* (2013.01); *H01L 27/2481* (2013.01); *H01L 45/1253* (2013.01); *H01L 45/04* (2013.01); *H01L 45/06* (2013.01); *H01L 45/1233* (2013.01); *H01L 45/1683* (2013.01)

(58) Field of Classification Search
CPC ......... H01L 27/11582; H01L 27/11578; H01L 29/7926; H01L 27/10802; H01L 27/2454; H01L 27/2481; H01L 27/1157; H01L 27/11573; H01L 27/11556; H01L 27/11565

See application file for complete search history.

(56) References Cited

U.S. PATENT DOCUMENTS

| | | | |
|---|---|---|---|
| 8,023,352 B2* | 9/2011 | Masuoka ............ | G11C 11/4023 365/210.1 |
| 2008/0175032 A1 | 7/2008 | Tanaka et al. | |
| 2011/0122680 A1 | 5/2011 | Ikeda et al. | |

FOREIGN PATENT DOCUMENTS

| | | |
|---|---|---|
| CN | 101546731 | 9/2009 |
| CN | 101548336 | 9/2009 |
| CN | 101826528 | 9/2010 |
| CN | 102197434 | 9/2011 |
| KR | 1020070058906 | 6/2007 |

* cited by examiner

*Primary Examiner* — Tony Tran
(74) *Attorney, Agent, or Firm* — IP & T Group LLP

(57) ABSTRACT

A semiconductor memory device comprising a bit line extending in a first direction, a vertical gate cell including a gate oxide layer and a gate metal layer that are formed in a pillar shape, a lower electrode and a data storage material layer formed on the vertical gate cell, and an interconnection layer formed on the data storage material layer.

4 Claims, 13 Drawing Sheets

X-Axis   Y-Axis

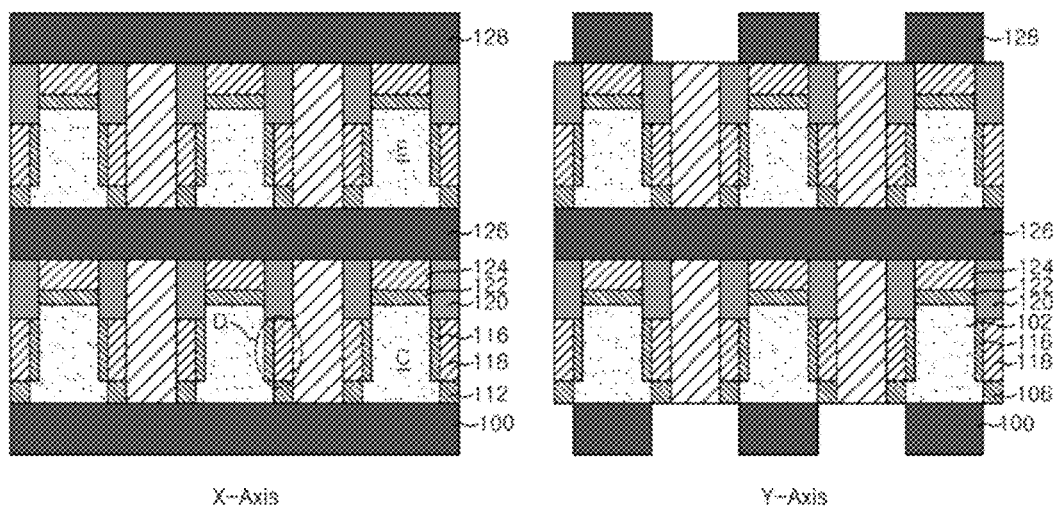
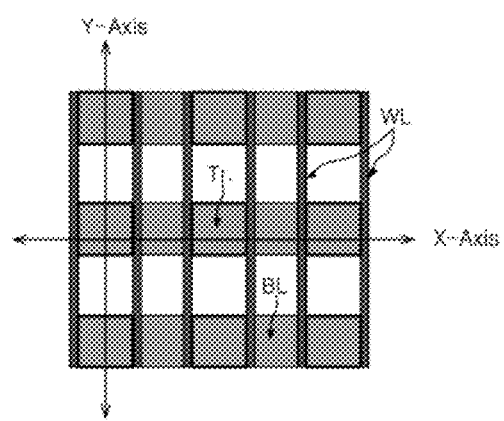

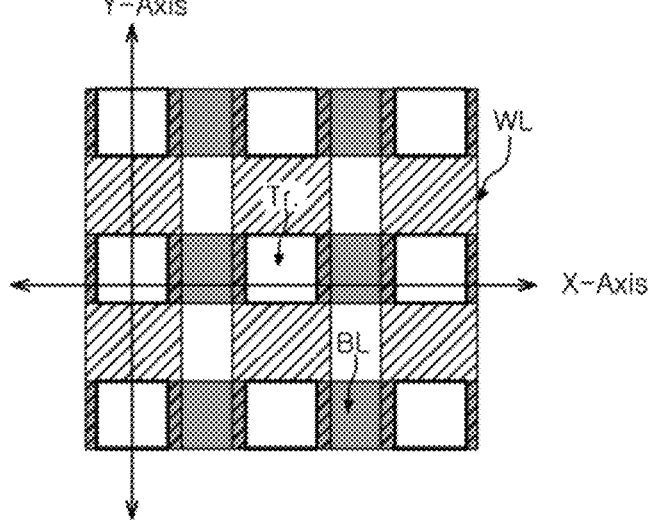

SEMICONDUCTOR MEMORY DEVICE AND METHOD OF MANUFACTURING THE SAME

CROSS-REFERENCES TO RELATED APPLICATION

This application is a continuation of U.S. patent application Ser. No. 13/489,753 filed on Jun. 6, 2012, which claims priority under U.S.C. 119(a) to Korean application number 10-2011-0135695, filed on Dec. 15, 2011 in the Korean Patent Office. The disclosure of each of the foregoing applications is incorporated by reference in its entirety.

BACKGROUND OF THE INVENTION

1. Technical Field

The present invention relates to a semiconductor device and a method of manufacturing the same, and more particularly, to a semiconductor memory device having a vertical gate cell and a method of manufacturing the same.

2. Related Art

Semiconductor memory devices may have features of low power consumption in addition to a non-volatile property of a flash memory device, a high-speed operation of a static random access memory (SRAM), and a high integration of a dynamic random access (DRAM). Devices such as ferroelectric random access memories (FRAMs), magnetic random access memories (MRAMs), phase-change random access memories (PCRAMs), or nano floating gate memories (NFGM) may provide the above listed features.

For example, a diode has been used as a switching device of the semiconductor memory device. However, when the diode is applied as the switching device, the semiconductor memory device may have the following features.

FIG. 1 is a circuit diagram of a semiconductor memory device including a switching device according to the conventional art.

Referring to FIG. 1, the semiconductor memory device has a multi-level stack (MLS) structure including a lower-level cell A and an upper-level cell B. The lower-level cell A and the upper-level cell B are formed below and above a common word line 20, respectively. The lower-level cell A includes of a diode 12 serving as a switching device and a phase-change material 16 formed between a first bit line 10 and the common word line 20, and the upper-level cell B includes of a diode 22 serving as a switching device and a phase-change material 26 formed between the common word line 20 and a second bit line 30.

FIG. 2 illustrates cross-sectional structure corresponding to the semiconductor memory device of FIG. 1

Referring to FIG. 2, a lower-level cell that includes a diode 12, a heater 14, and a phase-change material 16, which are sequentially formed, is formed on a first bit line 10. The lower-level cell further includes a buried insulating layer 18 formed between adjacent lower-level cells.

A common word line 20 is formed on the lower-level cell, and an upper-level cell is formed on the common word line 20. The upper-level cell includes a diode 22, a heater 24, and a phase-change material 26, which are sequentially formed. A buried insulating layer 28 is formed between the adjacent upper-level cells. A second bit line is formed on the upper-level cell.

In the conventional art as shown in FIGS. 1 and 2, the diodes 12 and 22 are formed as a switching device of the semiconductor memory device.

When the diode is used as the switching device, word lines and bit lines, which are individually separated, are needed to select the diodes. However, the word line and bit line are formed to be smaller as semiconductor memory devices are further integrated, and thus, a resistance of the word line is gradually increased. With an increase in the resistance of the word line, a voltage of the word line becomes closer to 0 Volt in a write or read operation of a cell, and thus, a voltage applied to the cell is reduced, which results in reduction in a read/write sensing margin. More specifically, a low resistance state of a cell is sensed as a high resistance state due to the increase in the voltage of the word line so that a word line bouncing to reduce a read sensing margin is caused.

In addition, as critical dimensions (CDs) of the word line and the bit line are reduced according to the further integration of the semiconductor memory device, an interconnection line resistance is gradually increased, and thus, an internal operation voltage is increased.

In addition, when the diode is formed as the switching device, all mask processes are performed with a cell pitch, a fabrication process is complicated, and production cost is increased.

SUMMARY

According to an exemplary embodiment, a method of manufacturing a semiconductor memory device includes forming a gate cell material layer on a bit line; etching a portion of the gate cell material layer in a line shape in a direction that the bit line extends to form a line shape etched region; forming a first spacer insulating layer in the line shape etched region; performing an etch-back process on the first spacer insulating layer to expose the bit line and form an etch-back region; forming a first oxide layer below the first spacer insulating layer; forming a first buried insulating layer in the etch-back region; etching the gate cell material layer in a direction perpendicular to the direction that the bit line extends to form a first trench; forming a second spacer insulating layer in the first trench on sidewalls of the gate cell material layer; performing an etch-back process on the second spacer insulating layer to expose the bit line; forming a second oxide layer below the second spacer insulating layer; forming a second buried insulating layer in the first trench; removing the first spacer insulating layer and the second spacer insulating layer; sequentially forming a gate oxide layer and a gate metal layer in a space formed by removing the first and second spacer insulating layer; removing a portion of the gate oxide layer and the gate metal layer; forming a third buried insulating layer in a space formed by removing the portion of the gate oxide layer and the gate metal layer; removing an upper portion of the gate cell material layer; sequentially forming a lower electrode and a data storage material layer in a space formed by removing the upper portion of the gate cell material layer; and forming an interconnection layer on the data storage material layer.

According to another exemplary embodiment, a method of manufacturing a semiconductor memory device includes forming a gate cell material layer on a bit line; etching a portion of the gate cell material layer in a direction perpendicular to a direction that the bit line extends to form a first trench; forming a spacer insulating layer in the first trench on sidewalls of the gate cell material layer; forming an oxide layer below the space insulating layer; forming a first buried insulating layer in the first trench; removing the spacer insulating layer; sequentially forming a gate oxide layer and a gate metal layer in a space formed by removing the spacer insulating layer; removing a portion of the gate oxide layer and the gate metal layer; forming a second buried insulating layer in a space formed by removing the portion of the gate oxide layer and the gate metal layer; removing an upper portion of the gate cell material layer; sequentially forming a lower electrode and a data storage material layer a space formed by removing the upper portion of the gate cell material layer; and forming an interconnection layer on the data storage material layer.

According to another exemplary embodiment, a method of manufacturing a semiconductor memory device includes forming a gate cell material layer on a bit line; patterning the gate cell material layer in a pillar shape; forming an insulating layer in a bottom portion of a region where the gate cell material layer is removed; forming a gate oxide layer on an exposed sidewall of the gate cell material layer; forming a gate metal layer on the gate oxide layer in the region where the gate cell material layer is removed; forming a first buried insulating layer in the region where the gate cell material layer is removed; removing a portion of the gate oxide layer and the gate metal layer; forming a second buried insulating layer in a space formed by removing the gate oxide layer and the gate metal layer; and removing an upper portion of the gate cell material layer; sequentially forming a lower electrode and a data storage material layer in a space formed by removing the upper portion of the gate cell material layer; and forming an interconnection layer on the data storage material layer.

BRIEF DESCRIPTION OF THE DRAWINGS

The above and other aspects, features, and other advantages of the subject matter of the present disclosure will be more clearly understood from the following detailed description taken in conjunction with the accompanying drawings, in which:

FIGS. 5A to 5G are views illustrating a method of manufacturing a semiconductor memory device of the layout in FIG. 4;

FIG. 6 is a view illustrating a layout of a semiconductor memory device according to a second exemplary embodiment of the present invention;

FIG. 8 is a view illustrating a layout of a semiconductor memory device according to a third exemplary embodiment of the present invention;

DETAILED DESCRIPTION

Figure 1:
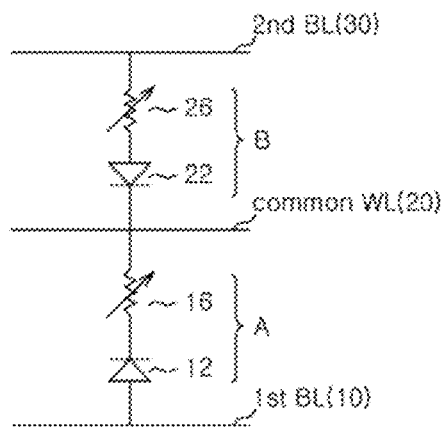
FIG. 1 is a circuit diagram illustrating a configuration of a semiconductor memory device including a switching device in the conventional art.
Figure 2:
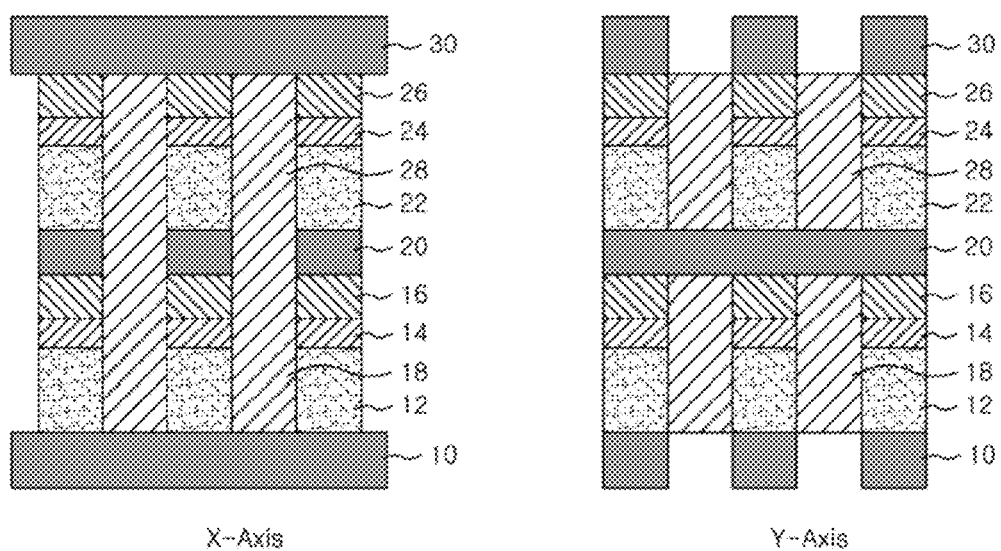
FIG. 2 is a cross-sectional view of a semiconductor memory device corresponding to FIG. 1.

Hereinafter, exemplary embodiments will be described in greater detail with reference to the accompanying drawings.

Exemplary embodiments are described herein with reference to cross-sectional illustrations that are schematic illustrations of exemplary embodiments (and intermediate structures). As such, variations from the shapes of the illustrations as a result, for example, of manufacturing techniques and/or tolerances, are to be expected. Thus, exemplary embodiments should not be construed as limited to the particular shapes of regions illustrated herein but may be to include deviations in shapes that result, for example, from manufacturing. In the drawings, lengths and sizes of layers and regions may be exaggerated for clarity. Like reference numerals in the drawings denote like elements. It is also understood that when a layer is referred to as being "on" another layer or substrate, it can be directly on the other or substrate, or intervening layers may also be present.

Hereinafter, a semiconductor memory device and a method of manufacturing the same according to an exemplary embodiment of the present invention will be described in detail with reference to the following drawings.

Figure 3:
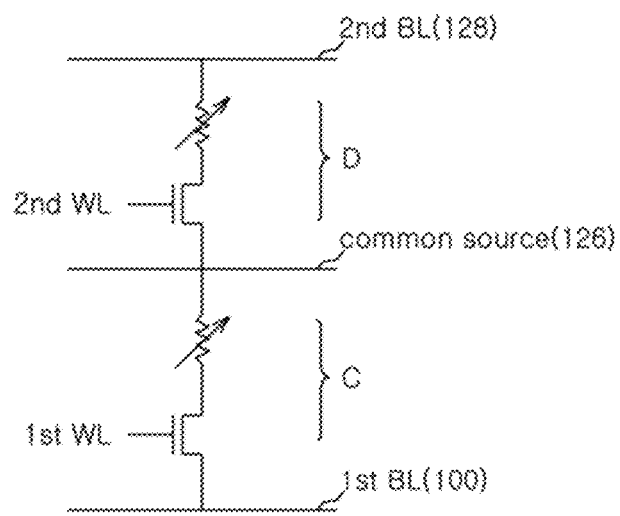
FIG. 3 is a circuit diagram illustrating a semiconductor memory device including a vertical gate cell according to an exemplary embodiment of the present invention.

FIG. 3 a view illustrating a circuit configuration of a semiconductor memory device including a vertical gate cell according to an exemplary embodiment of the present invention.

Referring to FIG. 3, the semiconductor memory device has a MLS that includes a lower-level cell C and an upper-level cell D formed below and above a common source 126, respectively. The lower-level cell C and upper-level cell D each includes a vertical gate cell, which serves as a switching device, and a phase-change material. The lower-level cell C is formed between a first bit line 100 and a common source 126, and the upper-level cell D is formed between the common source and a second bit line 128.

As described above, when the vertical gate cell serves as the switching device of the semiconductor memory device, gate control is performed through a word line, and data transfer is performed through the bit line. More specifically, the word line is floating to increase a voltage, thereby reducing power consumption. Thus, word line bouncing, which occurred in the conventional art, is suppressed. In addition, an increase in an internal operation voltage due to increase in an interconnection line resistance is suppressed, a fabrication process is simplified, and a fabrication cost is lowered. The present invention that has the above-described characteristics will be described in detail with reference to the following drawings.

Figure 4:
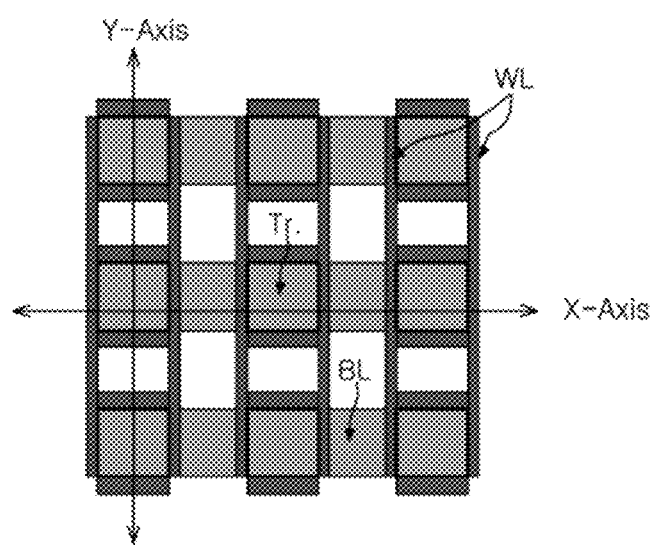
FIG. 4 is a view illustrating layout of a semiconductor memory device according to a first exemplary embodiment of the present Invention.

FIG. 4 illustrates a layout of a semiconductor memory device according to a first exemplary embodiment of the present invention.

Referring to FIG. 4, bit lines BL are formed in an X-axis direction and word lines WL are formed in a Y-axis direction perpendicular to the X-axis direction. A vertical gate cell Tr is formed at intersections of the bit lines and word lines.

FIGS. 5A to 5G are cross-sectional views illustrating a method of manufacturing a semiconductor memory device of the layout in FIG. 4.

Figure 5A:
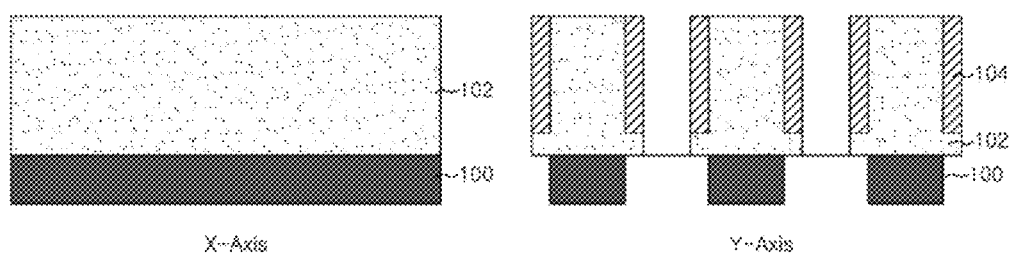
Figure 5B:
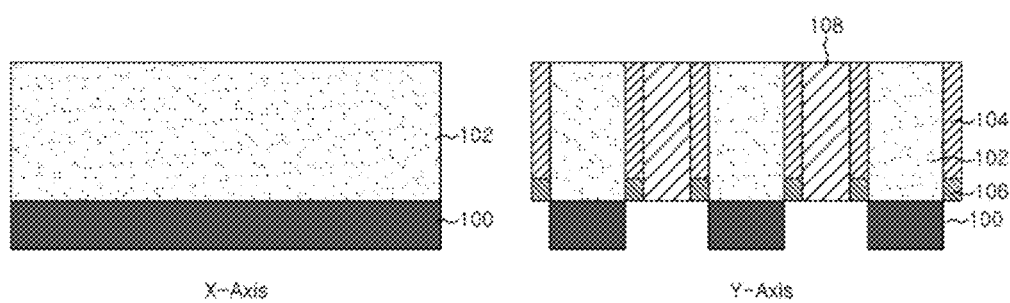

First, referring to FIG. 5A, a first bit line 100, which is connected to a drain of a vertical gate cell, is formed using a conductor. A gate cell material layer 102 for forming the vertical gate cell is formed on the first bit line 100.

More specifically, the first bit line 100 may include a metal, an alloy, a metal oxinitride, or a conductive carbon compound. For example, the first bit line 100 may include any one selected from the group consisting of tungsten (W), copper (Cu), titanium nitride (TiN), tantalum nitride (TaN), tungsten nitride (WN), molybdenum nitride (MoN), niobium nitride (NbN), titanium silicon nitride (TiSiN), titanium aluminum nitride (TiAlN), titanium boron nitride (TiBN), zirconium silicon nitride (ZrSiN), tungsten silicon nitride (WSiN), tungsten boron nitride (WBN), zirconium aluminum nitride (ZrAlN), molybdenum silicon nitride (MoSiN), molybdenum aluminum nitride (MoAlN), tantalum silicon nitride (TaSiN), tantalum aluminum nitride (TaAlN), titanium (Ti), molybdenum (Mo), tantalum (Ta), titanium silicide (TiSi), tantalum silicide (TaSi), titanium tungsten (TiW), titanium oxynitride (TiON), titanium aluminum oxynitride (TiAlON), tungsten oxynitride (WON), and tantalum oxynitride (TaON).

The gate cell material layer 102 may include a semiconductor material such as silicon (Si), a silicon germanium (SiGe), germanium (Ge), and gallium arsenide (GaAs). Specifically, the gate cell material layer 102 may be formed by depositing an N-doped or P-doped semiconductor material or an undoped semiconductor material to form a source, a drain, and a channel in a direction perpendicular to the extending direction of the bit line.

Subsequently, the gate cell material layer 102 is partially etched in a line shape in the x-direction, and a first spacer insulating layer 104 is formed in the area that was etched. Subsequently, a etch back process is performed to expose the first bit line 100.

Referring to FIG. 56, a selective oxidation process is performed on the gate cell material layer 102. A first oxide layer 106 is formed below the first spacer insulating layer 104 by the selective oxidation process. Subsequently, a first buried insulating layer 108 is formed in between the gate cell material layer 102, and a planarization process is performed on the first buried insulating layer 108.

Figure 5C:
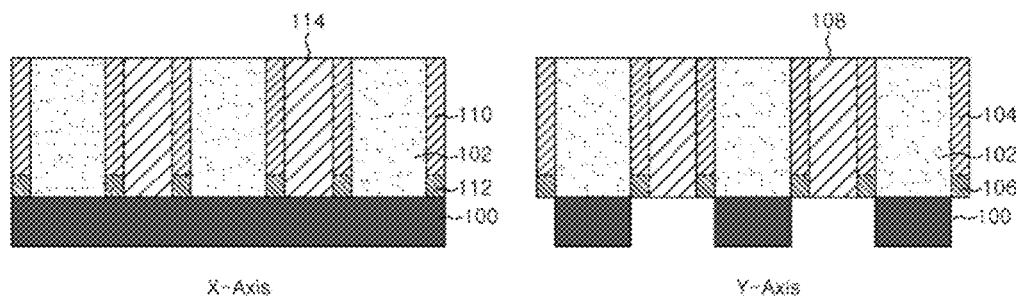

Referring to FIG. 5C, the gate cell material layer 102 is partially etched in the y-axis direction and a second spacer insulating layer 110 is formed. Subsequently, an etch back process is performed on the gate cell material layer 102 to expose the first bit line 100.

Next, a selective oxidation process is performed on the gate cell material layer 102 to form a second oxide layer 112 below the second spacer insulating layer 110. Subsequently, a second buried insulating layer 114 is formed in a space between the gate cell material layer 102 where the gate cell material is etched and removed, and a planarization process is performed on the second buried insulating layer 114.

More specifically, the first spacer insulating layer 104 and the second spacer insulating layer 110 may include the same material. The first buried insulating layer 108 and the second buried insulating layer 114 may include a material having a higher etch selectivity than the first spacer insulating layer 104 and the second spacer insulating layer 110.

Figure 5D:
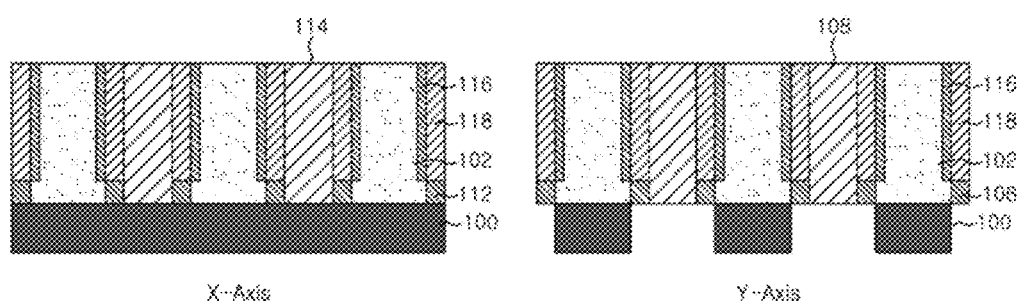

Referring to FIG. 5D, the first spacer insulating layer 104 and the second spacer insulating layer 110 are removed through a wet etching process. A gate oxide layer 116 and a gate metal layer 118 are sequentially formed in a space where the first spacer insulating layer 104 and the second spacer insulating layer 110 are etched and removed.

Figure 5E:
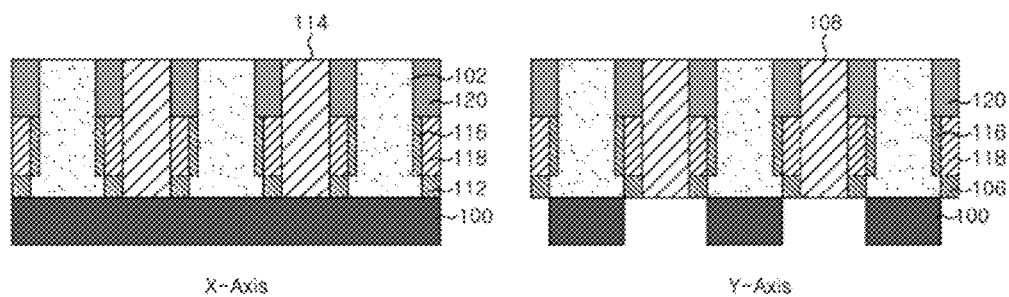

Referring to FIG. 5E, the gate oxide layer 116 and the gate metal layer 118 are partially removed, and a third buried insulating layer 120 is formed where the gate oxide layer 116 and the gate metal layer 118 are partially removed.

Figure 5F:
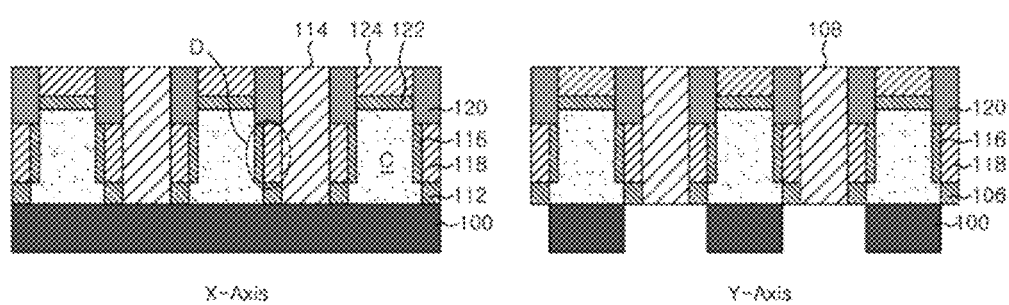

Referring to FIG. 5F, the gate cell material layer 102 is partially removed. Subsequently, a lower electrode (a heater) 122 and a data storage material layer (a phase-change material layer) 124 are sequentially formed in a region where the gate cell material layer 102 is partially removed to form a lower cell C.

As shown in FIG. 5F, a vertical gate cell D including the gate oxide layer 116 and the gate metal layer 118 is formed as a switching device.

The vertical gate cell D has a pillar shape formed perpendicular to the first bit line as shown in FIG. 5F. In the vertical gate cell having the pillar shape, the gate metal layer 118, which serves as a word line of a transistor, is formed in a floating structure, and thus, the vertical gate cell D is involved in increasing a voltage. Therefore, bouncing of a word line is suppressed.

A silicide layer using a material such as Ti, cobalt (Co), nickel (NI), W, platinum (Pt), lead (Pb), Mo, or Ta is further formed at an interface between the lower electrode 122 and the gate cell material layer 102 to reduce a contact resistance between the gate cell material layer 102 and the lower electrode 122. The lower electrode 122 may include a metal, an alloy, a metal oxinitride, or a conductive carbon compound. For example, the lower electrode 122 may be formed of a single layer or a compound layer including any one selected from the group consisting of W, Cu, TiN, TaN, WN, MoN, NbN, TiSiN, TiAlN, TiBN, ZrSiN, WSiN, WBN, ZrAlN, MoSiN, MoAlN, TaSiN, TaAlN, Ti, W, Mo, Ta, TiSi, TaSi, TiW, TiON, TiAlON, WON, and TaON.

The data storage layer 124 is a resistive layer. The memory device may be classified as a phase-change random access memory (PCRAM), a magnetic random access memory (MRAM), a spin-transfer torque MRAM (STTM-RAM), and a polymer random access memory (PoRAM) according to a material used to form the data storage material layer 124. If the data storage material layer 124 is formed of a material for a PCRAM, the data storage material layer 124 may include a material layer selected from tellurium (Te), selenium (Se), germanium (Ge), a compound thereof, and an alloy thereof. More specifically, the data storage material layer 124 may be formed of a material selected from the group consisting of Te, Se, Ge, bismuth (Bi), Pb, tin (Sn), arsenic (As), sulfur (S), Si, phosphorus (P), oxygen (O), nitrogen (N), a compound thereof, and an alloy thereof.

A dimension of the data storage material layer 124 may be controlled using a process of forming the first spacer insulating layer 104 and the second spacer insulating layer 110.

Referring to FIG. 5G, a conductive layer 126 having a plate shape is formed. The conductive layer 126 may include a metal, an alloy, a metal oxinitride, or a conductive carbon compound. For example, the conductive layer 126 may be formed of a single layer or a compound layer including any one selected from the group consisting of W, Cu, TiN, TaN, WN, MoN, NbN, TiSiN, TiAlN, TiBN, ZrSiN, WSiN, WBN, ZrAlN, MoSiN MoAlN, TaSiN, TaAlN, Ti, W, Mo, Ta, TiSi, TaSi, TiW, TiON, TiAlON, WON, and TaON.

The conductive layer 126 is a source (interconnection) connected to a common source of a bit line. Since the source is formed in a plate shape, an interconnection line resistance is reduced, and thus, an internal operation voltage is reduced. A mask process may be performed four or more times when a switching device is formed as a diode as in the conventional art or a switching device is formed as the vertical gate cell as in the present invention. However, when the diode is formed as a switching device, all mask processes are performed in a cell pitch, and thus, the fabrication process is complicated. However, when the vertical gate cell is formed as a switching device, the conductive layer, which is an interconnection layer connected to the common source, may be formed in a plate shape, and a low quality of exposure apparatus may be used in one or more mask processes among four mask processes. As a result of using the vertical gate cell, a total fabrication cost is reduced.

Subsequently, an upper-level cell E is further formed on the conductive layer 126 through the above-described processes of FIGS. 5A to 5F. A second bit line 128 having the same shape as the first bit line 100 is formed. More specifically, the second bit line 128 may include the same material as the first bit line 100, for example, a metal, an alloy, a metal oxinitride, or a conductive compound. For example, the second bit line 128 may formed of a single layer or a compound layer including any one selected from the group consisting of W, Cu, TiN, TaN, WN, MoN, NbN, TiSiN, TiAlN, TiBN, ZrSiN, WSiN, WBN, ZrAlN, MoSiN MoAlN, TaSiN, TaAlN, Ti, W, Mo, Ta, TiSi, TaSi, TiW, TiON, TiAlON, WON, and TaON.

The vertical gate cell is applied as a switching device of the semiconductor memory device as described above, and a word line of a transistor is formed in a floating structure and involved only in increasing a voltage (only serving as gate control not a current path). As a result, power consumption is reduced. In addition, the source is formed as a ground in a plate shape, and thus, reduction in a read margin due to a resistance is suppressed so that bouncing of the word line is prevented.

In the conventional art, as a design rule is reduced, CDs of the word line and the bit line are reduced and an interconnection line resistance is gradually increased. However, in the present invention, the source is formed in a plate shape, and thus, an increase in the interconnection line resistance is prevented.

As described above, the vertical gate cell is formed as a switching device, and an interconnection layer connected to the final source is implemented in a plate shape. Therefore, a low quality exposure apparatus is used in one or more of the four mask processes, and thus, a total fabrication cost is reduced.

FIG. 6 illustrates a layout of a semiconductor memory device according to a second memory device of the present invention.

Referring to FIG. 6, bit lines BL are formed in an X-axis direction and word lines WL are formed in a Y-axis direction perpendicular to the X-axis direction. A vertical gate cell Tr is formed at interconnections of the bit lines and word lines.

FIGS. 7A to 7D are cross-sectional views illustrating a method of manufacturing a semiconductor memory device of the layout of FIG. 6.

Figure 7A:
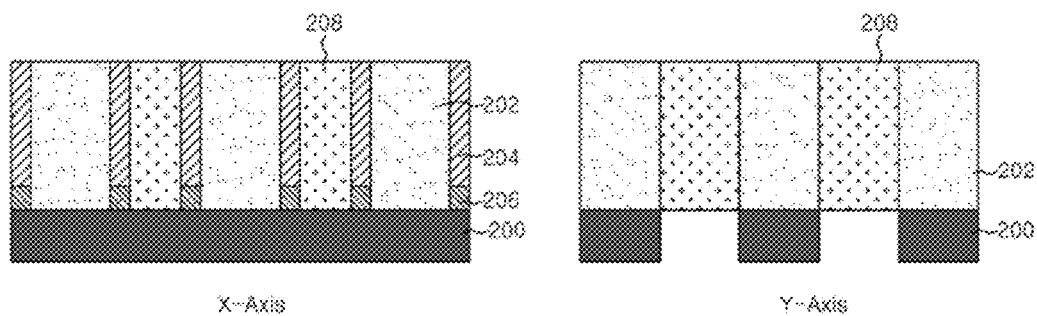
FIGS. 7A to 7D are views illustrating a method of manufacturing a semiconductor memory device of the layout in FIG. 6.

First, referring to FIG. 7A, a first bit line 200, which is connected to a drain of a vertical gate cell, is formed using a conductive material. A gate cell material layer 202 for forming the vertical gate cell is formed on the first bit line 200.

More specifically, the first bit line 200 may include a metal, an alloy, a metal oxinitride or a conductive carbon compound. For example, the first bit line 200 may be formed of a single layer or a compound layer including any one selected from the group consisting of W, Cu, TiN, TaN, WN, MoN, NbN, TiSiN, TiAlN, TiBN, ZrSiN, WSiN, WBN, ZrAlN, MoSiN, MoAlN, TaSiN, TaAlN, Ti, W, Mo, Ta, TiSi, TaSi, TiW, TiON, TiAlON, WON, and TaON.

The gate cell material layer 202 may include a semiconductor material such as Si, SiGe, Ge, or GaAs. More specifically, the gate cell material layer 202 may be formed by depositing an N-type or P-type doped semiconductor material or an undoped semiconductor material to form a source, a drain, and a channel in a direction perpendicular to the extending direction of the first bit line 200.

Subsequently, the gate cell material layer 202 is partially etched in the x-direction, and a space insulating layer 204 is formed.

A selective oxidation process is performed on the gate cell material layer 202. By the selective oxidation process oxidation, an oxide layer 206 is formed below the spacer insulating layer 204. Subsequently, a first buried insulating layer 208 is formed between the gate cell material layer 202 where the gate cell material 202 is etched and removed, and a planarization process is performed on the first buried insulating layer 208. Here, the first buried insulating layer 208 may include a material having an etch selectivity to the spacer insulating layer 204.

Figure 7B:
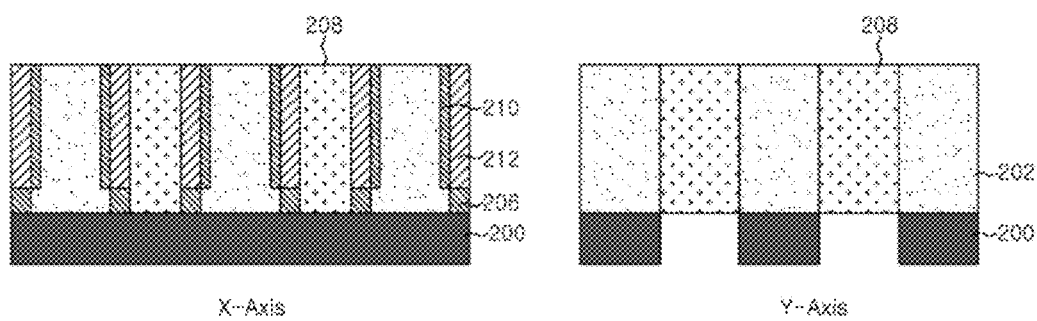

Referring to FIG. 7B, the spacer insulating layer 204 is removed through a wet etching process. Subsequently, a gate oxide layer 210 and a gate metal layer 212 are sequentially formed in a space where the spacer insulating layer 204 is etched and removed.

Figure 7C:
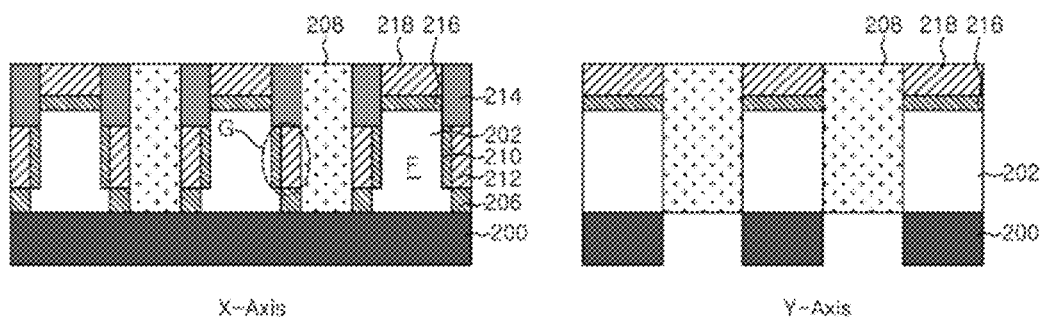

Referring to FIG. 7C, the gate oxide layer 210 and the gate metal layer 212 are partially etched, and a second buried insulating layer 214 is formed. In addition, the gate cell material layer 202 is partially etched, and a lower electrode (a heater) 216 and a data storage material layer (a phase-change material layer) 218 are sequentially formed to form a lower-level cell F.

As shown in FIG. 7C, a vertical gate cell G including the gate oxide layer 210 and the gate metal layer 212 is formed as a switching device. The vertical gate cell G has a pillar shape perpendicular to the first bit line 200. In the vertical gate cell G having the pillar shape, the gate metal layer 212, which serves as a word line of a transistor, is formed in a floating structure and involved in increasing a voltage so that bouncing of the word line is prevented.

A silicide layer is further formed at an interface between the lower electrode 216 and the gate cell material layer 202 to reduce a contact resistance between the gate cell material layer 202 and the lower electrode 216. The lower electrode 216 may include a metal, an alloy, a metal oxinitride, or a conductive carbon compound. For example, the lower electrode 216 may be formed of a single layer or a compound layer including any one selected from the group consisting of W, Cu, TiN, TaN, WN, MoN, NbN, TiSiN, TiAlN, TiBN, ZrSiN, WSiN, WBN, ZrAlN, MoSiN, MoAlN, TaSiN, TaAlN, Ti W, Mo, Ta, TiSi, TaSi, TiW, TiON, TiAlON, WON, and TaON.

The data storage material layer 218 may be formed of a material for a PCRAM, a ReRAM, a STTRAM, a PoRAM, or the like. When the data storage material layer 218 is formed of a material for a PCRAM, the data storage material layer 218 may be formed of a material selected from the group consisting of Te, Se, Ge, a compound thereof, or an alloy thereof. More specifically, the storage material layer 218 may be formed of any one selected from the group consisting of Te, Se, Ge, Sb, Bi, Pb, Sn, As, S, Si, P, O, N, a compound thereof, and an alloy thereof.

A dimension of the data storage material layer 218 may be controlled using a process of forming the spacer insulating layer 204.

Figure 7D:
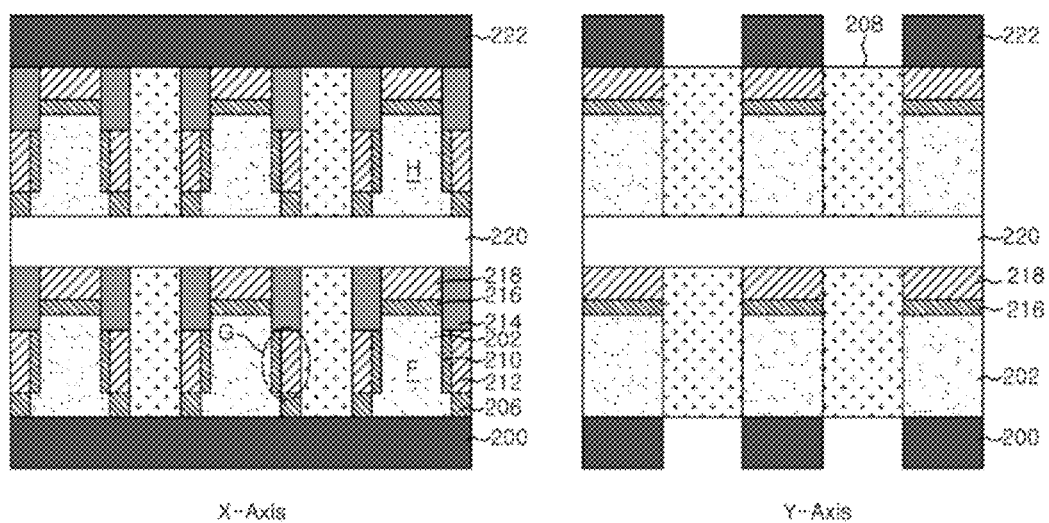

Referring to FIG. 7D, after forming the data storage material layer 218, a conductive layer 220 having a plate shape and connected to a common source of the bit line is formed. The conductive layer 220 may include a metal, alloy, a metal oxynitride, a conductive carbon compound. For example, the conductive layer 220 may be formed of a single layer or a compound layer including any one selected from the group consisting of W, Cu, TiN, TaN, WN, MoN, NbN, TiSiN, TiAlN, TiBN, ZrSiN, WSiN, WBN, ZrAlN, MoSiN, MoAlN, TaSiN, TaAlN, Ti, W, Mo, Ta, TiSi, TaSi, TiW, TiON, TiAlON, WON, and TaON.

The conductive layer 220 is a source (interconnection line) connected to the common source of the bit line. Since the source is formed in a plate shape, an interconnection line resistance is reduced, and thus, an internal operation voltage is reduced. A mask process may be performed four or more times when a switching device is formed as a diode as in the conventional art or a switching device is formed of a vertical gate cell as in the present invention. However, when the diode is formed as a switching device, all mask processes are performed in a cell pitch, and thus, the fabrication process is complicated. However, when the vertical gate cell is formed as a switching device, the conductive layer, which is an interconnection layer connected to the common source, may be formed in a plate shape, and a low quality exposure apparatus may be used in one or more mask processes among four mask processes. As a result of using the vertical gate cell, a total fabrication cost is reduced.

Subsequently, an upper-level cell H is further formed on the conductive layer 220 through the above-described processes of FIGS. 7A to 7C. A second bit line 222 having the same shape as the first bit line 200 is formed. More specifically, the second bit line 222 may include the same material as the first bit line 200, for example, a metal, an alloy, a metal oxinitride, or a conductive compound. For example, the second bit line 222 may formed of a single layer or a compound layer including any one selected from the group consisting of W, Cu, TiN, TaN, WN, MoN, NbN, TiSiN, TiAlN, TiBN, ZrSiN, WSiN, WBN, ZrAlN, MoSiN MoAlN, TaSiN, TaAlN, Ti, W, Mo, Ta, TiSi, TaSi, TiW, TiON, TiAlON, WON, and TaON.

The vertical gate cell is applied as a switching device of the semiconductor memory device as described above, and a word line of a transistor is formed in a floating structure and involved only in increasing a voltage (only serving as gate control not a current path). As a result, power consumption is reduced. In addition, the source is formed as a ground in a plate shape, and thus, reduction in a read margin due to a resistance is suppressed so that bouncing of the word line is prevented.

In the conventional art, as a design rule is reduced, CDs of the word line and the bit line are reduced and an interconnection line resistance is gradually increased. However, in the present invention, the source is formed in a plate shape, and thus, an increase in the interconnection line resistance is prevented.

As described above, the vertical gate cell is formed as a switching device, and an interconnection layer connected to the final source is implemented in a plate shape. Therefore, a low quality exposure apparatus is used in one or more of the four mask processes, and thus, a total fabrication cost is reduced.

FIG. 8 illustrates a layout of a semiconductor memory device according to a third memory device of the present invention.

Referring to FIG. 8, bit lines BL are formed in an X-axis direction and word lines WL are formed in a Y-axis direction perpendicular to the X-axis direction. A vertical gate cell Tr is formed at each of interconnections of the bit lines and word lines.

FIGS. 9A to 9D are cross-sectional views illustrating a method of manufacturing a semiconductor memory device of the layout of FIG. 8.

Figure 9A:
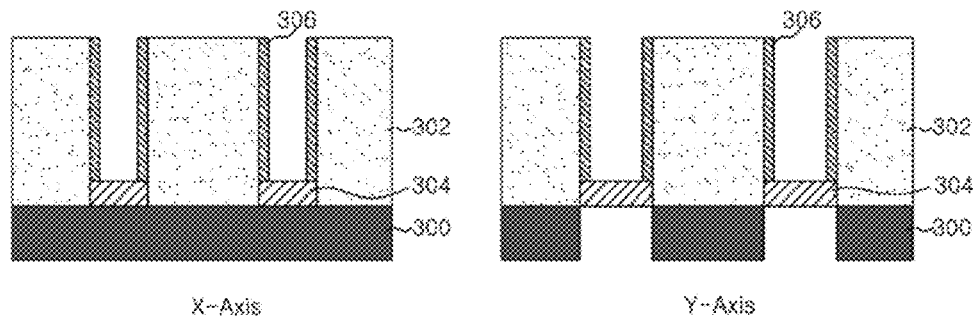
FIG. 9A to 9D are views illustrating a method of manufacturing a semiconductor memory device of the layout in FIG. 8.

First, referring to FIG. 9A, a first bit line 300, which is connected to a drain of a vertical gate cell, is formed using a conductive material. A gate cell material layer 302 for forming the vertical gate cell is formed on the first bit line 300.

More specifically, the first bit line 300 may include a metal, an alloy, a metal oxinitride or a conductive carbon compound. For example, the first bit line 300 may be formed of a single layer or a compound layer including any one selected from the group consisting of W, Cu, TiN, TaN, WN, MoN, NbN, TiSiN, TiAlN, TiBN, ZrSiN, WSiN, WBN, ZrAlN, MoSiN, MoAlN, TaSiN, TaAlN, Ti, W, Mo, Ta, TiSi, TaSi, TiW, TiON, TiAlON, WON, and TaON.

The gate cell material layer 302 may include a semiconductor material such as Si, SiGe, Ge or GaAs. More specifically, the gate cell material layer 302 may be formed by depositing an N-type or P-type doped semiconductor material or an undoped semiconductor material to form a source, a drain, and a channel in a direction perpendicular to the extending direction of the first bit line 300.

Subsequently, the gate cell material layer 302 is patterned in a pillar shape, and an insulating layer 304 is formed in a bottom portion of a trench formed by removing the gate cell material layer 302. The gate oxide layer 306 is formed on an exposed sidewall of the gate cell material layer 302.

Figure 9B:
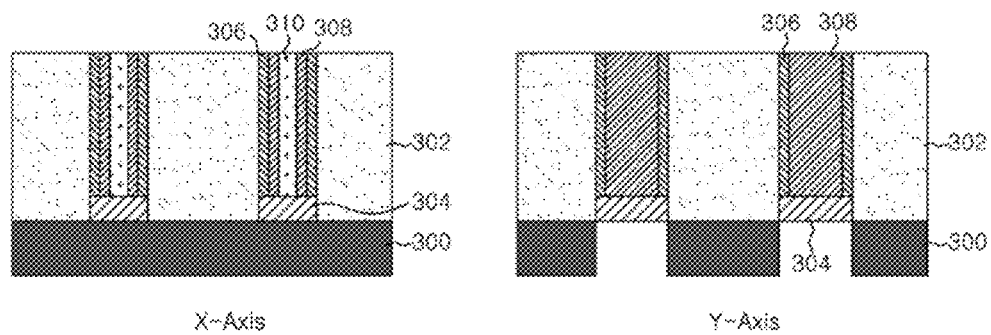

Referring to FIG. 9B, a gate metal layer 308 is formed on the gate oxide layer 306, and a planarization process is performed after forming the gate metal layer 308. Subsequently, a first buried insulating layer 310 is formed between the gate metal layer 308 where the gate cell material layer 302 is removed.

Figure 9C:
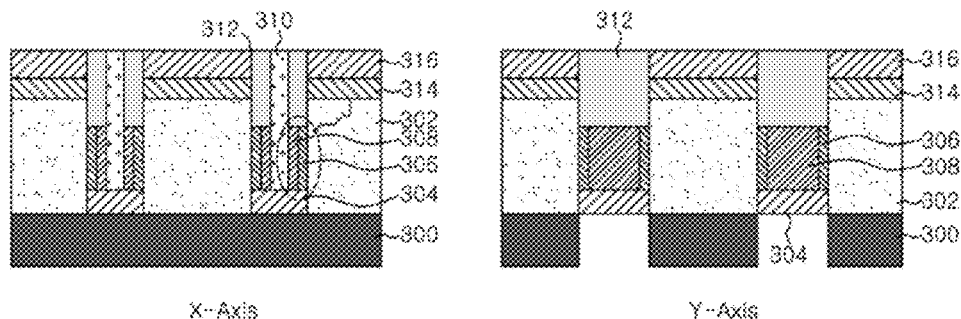

Referring to FIG. 9C, the gate oxide layer 306 and the gate metal layer 308 are partially etched, and a second buried insulating layer 312 is formed where the gate oxide layer 306 and the gate metal layer 308 are partially etched.

Subsequently, the gate cell material layer 302 is partially etched, and a lower electrode (a heater) 314 and a data storage material layer (a phase-change material layer) 316 are sequentially formed where the gate cell material layer 302 is removed to form a lower-level cell I.

As shown in FIG. 9C, a vertical gate cell J including the gate oxide layer 306 and the gate metal layer 308 is formed as a switching device. The vertical gate cell J has a pillar shape perpendicular to the first bit line 300. In the vertical gate cell J having the pillar shape, the gate metal layer 308, which serves as a word line of a transistor, is formed in a floating structure and involved in increasing a voltage so that bouncing of the word line is prevented.

A silicide layer is further formed at an interface between the lower electrode 314 and the gate cell material layer 302 to reduce a contact resistance between the gate cell material layer 302 and the lower electrode 314. The lower electrode 314 may include a metal, an alloy, a metal oxynitride, or a conductive carbon compound. For example, the lower electrode 314 may be formed of a single layer or a compound layer including any one selected from the group consisting of W, Cu, TiN, TaN, WN, MoN, NbN, TiSiN, TiAlN, TiBN, ZrSiN, WSiN, WBN, ZrAlN, MoSiN, MoAlN, TaSiN, TaAlN, Ti W, Mo, Ta, TiSi, TaSi, TiW, TiON, TiAlON, WON, and TaON.

The data storage material layer 316 may be formed of a material for a PCRAM, a ReRAM, a STTRAM, a PoRAM, or the like. When the data storage material layer 316 is formed of a material for a PCRAM, the data storage material layer 316 may be formed of a material selected from the group consisting of Te, Se, Ge, a compound thereof, or an alloy thereof. More specifically, the storage material layer 316 may be formed of any one selected from the group consisting of Te, Se, Ge, Sb, Bi, Pb, Sn, As, S, Si, P, O, N, a compound thereof, and an alloy thereof.

Figure 9D:
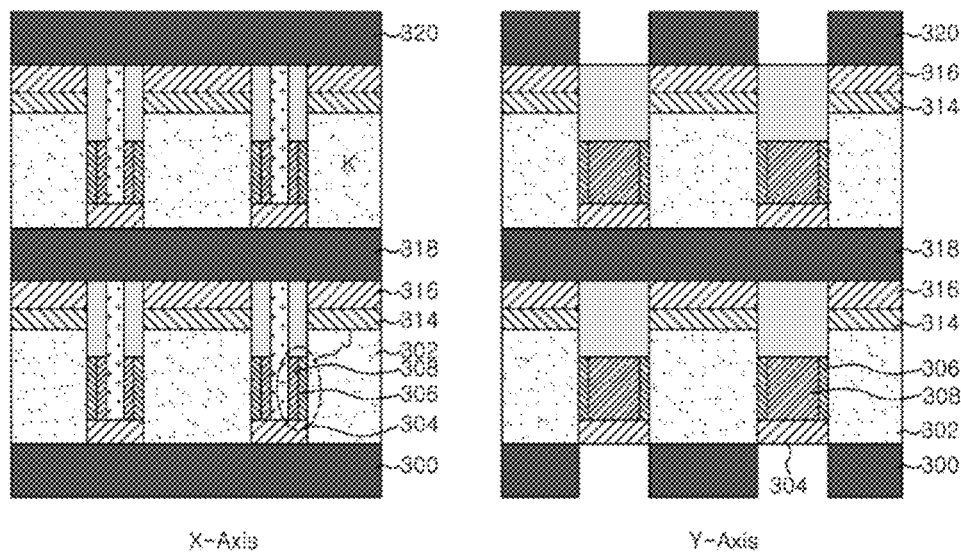

Referring to FIG. 9D, after forming the data storage material layer 316, a conductive layer 318 having a plate shape and connected to a common source of the bit line is formed. The conductive layer 318 may include a metal, alloy, a metal oxynitride, a conductive carbon compound. For example, the conductive layer 318 may be formed of a single layer or a compound layer including any one selected from the group consisting of W, Cu, TiN, TaN, WN, MoN, NbN, TiSiN, TiAlN, TiBN, ZrSiN, WSiN, WBN, ZrAlN, MoSiN, MoAlN, TaSiN, TaAlN, Ti, W, Mo, Ta, TiSi, TaSi, TiW, TiON, TiAlON, WON, and TaON.

The conductive layer 318 is a source (interconnection line) connected to the common source of a bit line. Since the source is formed in a plate shape, an interconnection line resistance is reduced and thus an internal operation voltage is reduced. A mask process may be performed four or more times when a switching device is formed of a diode as in the conventional art or a switching device is formed of a vertical gate cell as in the present invention. However, when the diode is formed as a switching device, all mask processes are performed in a cell pitch, and thus, the fabrication process is complicated. However, when the vertical gate cell is formed as a switching device, the conductive layer, which is an interconnection layer connected to the common source, may be formed in a plate shape, and a low quality exposure apparatus may be used in one or more mask processes among four mask processes. As a result of using the vertical gate cell, total fabrication cost is reduced.

Subsequently, an upper-level cell K is further formed on the conductive layer 318 through the above-described processes of FIGS. 9A to 9C. A second bit line 320 having the same shape as the first bit line 300 is formed. More specifically, the second bit line 320 may include the same material as the first bit line 300, for example, a metal, an alloy, a metal oxinitride, or a conductive compound. For example, the second bit line 320 may formed of a single layer or a compound layer including any one selected from the group consisting of W, Cu, TiN, TaN, WN, MoN, NbN, TiSiN, TiAlN, TiBN, ZrSiN, WSiN, WBN, ZrAlN, MoSiN MoAlN, TaSiN, TaAlN, Ti, W, Mo, Ta, TiSi, TaSi, TiW, TiON, TiAlON, WON, and TaON.

The vertical gate cell is applied as a switching device of the semiconductor memory device as described above, and a word line of a transistor is formed in a floating structure and involved only in increasing a voltage (only serving as gate control not a current path). As a result, power consumption is reduced. In addition, the source is formed as a ground in a plate shape, and thus, reduction in a read margin due to a resistance is suppressed so that bouncing of the word line is prevented.

In the conventional art, as a design rule is reduced, CDs of the word line and the bit line is reduced and an interconnection line resistance is gradually increased. However, in the present invention, the source is a plate shape, and thus, an increase in the Interconnection line resistance is prevented.

As described above, the vertical gate cell is formed as a switching device, and an interconnection layer connected to the final source is implemented in a plate shape. Therefore, a low quality exposure apparatus is used in one or more of the total four mask processes, and thus, a total fabrication cost is reduced.

The above-described exemplary embodiment has described that the lower-level cell and the upper-level cell are stacked in the MLS structure, however the number of cells stacked may be more than two.

Figure 10:
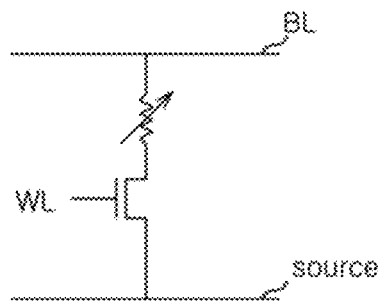
FIG. 10 is a view illustrating another circuit configuration of a semiconductor memory device having a vertical gate cell according to an exemplary embodiment of the present invention.
Figure 11:
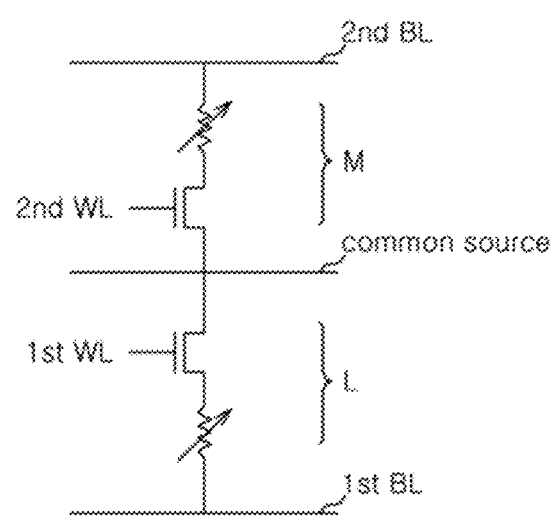
FIG. 11 is a view illustrating another circuit configuration of a semiconductor memory device including a vertical gate cell according to an exemplary embodiment of the present invention.
Figure 12:
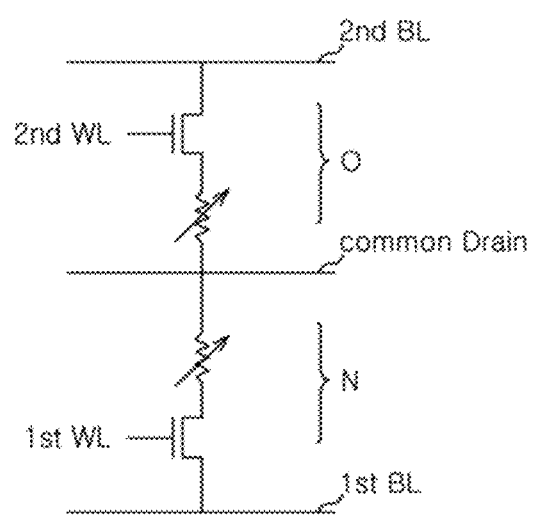
FIG. 12 is a view illustrating another circuit configuration of a semiconductor memory device including a vertical gate cell according to an exemplary embodiment of the present invention.

FIGS. 10 to 12 illustrate applied circuits of a semiconductor memory device including a vertical gate cell according to exemplary embodiments of the present invention.

First, FIG. 10 illustrates a circuit configuration of an MLS structure as shown in FIG. 3.

Although the semiconductor memory device is configured as a single layered-circuit by applying a vertical gate cell according to the exemplary embodiment, the semiconductor memory device can have the same effect as in the above-described MLS. In addition, the same effect can be obtained when the vertical gate cells are formed in a stacked structure, for example, three levels or more.

FIG. 11 illustrates an MLS circuit of a semiconductor memory device having a vertical gate cell according to another exemplary embodiment of the present invention.

Referring to FIG. 11, a lower-level cell L and an upper-level cell M are formed below and above of a common source, respectively. In the lower-level cell L, a phase-change material is formed on a first bit line, and a vertical gate cell is formed between the phase-change material and the common source. In the upper-level cell M, a vertical gate cell is formed on the common source, and a phase-change material is formed between the vertical gate cell and a second bit line.

FIG. 12 illustrates a semiconductor memory device having a MLS circuit including a vertical gate cell according to another exemplary embodiment.

Referring to FIG. 12, a lower-level cell N and an upper-level cell O are formed below and above a common drain, respectively. In the lower-level cell N, a vertical gate cell is formed on a first bit line, and a phase-change material is formed between the vertical gate cell and the common drain. In the upper-level cell O, a phase-change material is formed on the common drain, and a vertical gate cell is formed between the phase-change material and a second bit line.

FIGS. 11 and 12 illustrate circuits that have different element positions than the MLS structure as shown in FIG. 3. Although the positions of the elements are changed as described above, the same effect as in the circuit configuration as shown in FIG. 3 can be obtained.

In addition, the MLS structure as shown in FIGS. 11 and 12 may be replaced with a single structure or a stacked structure of three layers or more, and the replaced structure has the same effect as in the above-described MLS structure.

When the diode is used as the switching device, word lines and bit lines, which are individually separated, are needed to select the diodes in the conventional art. However, a word line and a bit line are smaller due to reduction in a design rule, and thus, a resistance of the word line is gradually increased. With the increase in the resistance of the word line, a voltage of the word line becomes 0 V or more in a write or read operation of a cell, and a voltage applied to the cell in reduced, resulting in reduction in a read/write sensing margin. More specifically, a low resistance state of a cell is sensed as a high resistance state due to an increase in the voltage of the word line so that the word line bouncing to reduce a read sensing margin is caused.

However, when the vertical gate cell is applied as the switching device of the semiconductor memory device as in the above-described exemplary embodiments, the word line is floating to function to increase a voltage, thereby reducing power consumption. Thus, word line bouncing is suppressed.

In the related art, as CDs of the word line and the bit line are reduced according to the reduction in a design rule, an interconnection line resistance is gradually increased. However, the source is formed in a plate shape in the exemplary embodiment, and thus, an interconnection line resistance is reduced so that the internal operation voltage is lowered.

A mask process should be performed four or more times when a switching device is formed of a diode as in the conventional art or when a switching device is formed of a vertical gate cell as in the present invention. However, when the diode is formed as a switching device, all mask processes are performed in a cell pitch, and thus, the fabrication process is complicated. However, when the vertical gate cell is formed as a switching device, the conductive layer, which is an interconnection layer connected to the common source, may be formed in a plate shape, and a low quality of exposure apparatus may be used in one or more mask process among the four mask processes. As a result, a total cost of fabrication is reduced.

While certain embodiments have been described above, it will be understood that the embodiments described are by way of example only. Accordingly, the devices and methods described herein should not be limited based on the described embodiments. Rather, the systems and methods described herein should only be limited in light of the claims that follow when taken in conjunction with the above description and accompanying drawings.

What is claimed is:

1. A semiconductor memory device, comprising:
 a first bit line extending in a first direction;
 a first level memory cell structure vertically stacked over the first bit line, wherein the first level memory cell structure includes first memory cells and a first insulating layer, wherein the first insulating layer insulates the first memory cells from each other, wherein each of the first memory cells includes a first pillar, a first word line formed over a sidewall of the first pillar, a first gate insulating layer formed between the first pillar and the first word line, and a first data storage material layer formed over the first pillar, wherein the first word line is arranged in perpendicular to the first bit line;
 a common source line vertically stacked over the first level memory cell structure and electrically coupled to the first data storage material layer, wherein the common source line covers a whole area of the first memory cells and a whole area of the first insulating layer;
 a second level memory cell structure vertically stacked over the common source line, wherein the second level memory cell structure includes second memory cells and a second insulating layer, wherein the second insulating layer insulates the second memory cells from each other, wherein each of the second memory cells includes a second pillar, a second word line formed over a sidewall of the second pillar, a second gate insulating layer formed between the second pillar and the second word line, and a second data storage material layer formed over the second pillar, wherein the second word line is arranged in perpendicular to the first bit line; and
 a second bit line stacked over the second level memory cell structure and electrically coupled to the second data storage material layer,
 wherein a stacking direction of the first level memory cell structure, the common source line, the second level memory cell structure, and the second bit line is parallel to a direction in which both of a first channel of the first level memory cell structure and a second channel of the second level memory cell structure extend.

2. The semiconductor memory device of claim 1, wherein the second bit line extends to a second direction perpendicular to the first direction.

3. The semiconductor memory device of claim 1, wherein the common source line is configured to receive a ground voltage.

4. The semiconductor memory device of claim 1, wherein at least one of the first word line and the second word line is floated.

* * * * *